(12) United States Patent
Yin

(10) Patent No.: US 12,224,290 B2
(45) Date of Patent: Feb. 11, 2025

(54) ARRAY SUBSTRATE, METHOD FOR FABRICATING SAME, AND DISPLAY PANEL

(71) Applicant: Wuhan China Star Optoelectronics Technology Co., Ltd., Hubei (CN)

(72) Inventor: Wen Yin, Hubei (CN)

(73) Assignee: Wuhan China Star Optoelectronics Technology Co., Ltd., Wuhan (CN)

( * ) Notice: Subject to any disclaimer, the term of this patent is extended or adjusted under 35 U.S.C. 154(b) by 0 days.

(21) Appl. No.: 17/764,220

(22) PCT Filed: Mar. 14, 2022

(86) PCT No.: PCT/CN2022/080666
§ 371 (c)(1),
(2) Date: Mar. 28, 2022

(87) PCT Pub. No.: WO2023/159688
PCT Pub. Date: Aug. 31, 2023

(65) Prior Publication Data
US 2024/0047483 A1   Feb. 8, 2024

(30) Foreign Application Priority Data
Feb. 28, 2022 (CN) .......................... 202210185018.8

(51) Int. Cl.
*H01L 27/12* (2006.01)
*G02F 1/1362* (2006.01)
*G02F 1/1368* (2006.01)

(52) U.S. Cl.
CPC .... *H01L 27/1248* (2013.01); *G02F 1/136209* (2013.01); *G02F 1/136222* (2021.01); *G02F 1/1368* (2013.01); *H01L 27/1259* (2013.01)

(58) Field of Classification Search
CPC ......... G02F 1/136222; G02F 1/136209; G02F 1/1368; H01L 27/1248; H01L 27/1259
(Continued)

(56) References Cited

U.S. PATENT DOCUMENTS

| 5,886,761 A * | 3/1999 | Sasaki ................ H01L 27/1288 |
| | | 257/E29.294 |
| 6,639,244 B1 * | 10/2003 | Yamazaki ........... H01L 27/1255 |
| | | 257/70 |

(Continued)

FOREIGN PATENT DOCUMENTS

| CN | 102830556 | 12/2012 |
| CN | 103531610 | 1/2014 |

(Continued)

OTHER PUBLICATIONS

Birendra Bahadur, Liquid Crystals Applications and Uses, 1990, World Scientific, vol. 1, pp. 171-194 (Year: 1990).*

(Continued)

*Primary Examiner* — Dung T Nguyen
*Assistant Examiner* — David Y Chung

(57) ABSTRACT

An array substrate includes an opening area and a non-opening area, and further includes a first substrate, a gate insulating layer, a first interlayer insulating layer, and a second interlayer insulating layer. The gate insulating layer is disposed on the first substrate and located in the opening area and the non-opening area. The first interlayer insulating layer is disposed on a side of the gate insulating layer away from the first substrate and located in the non-opening area. The second interlayer insulating layer is disposed on a side of the first interlayer insulating layer away from the first substrate and located in the opening area and the non-opening area. A projection of the first interlayer insulating layer on the first substrate is tangent to or separated from a projection of the opening area on the first substrate. A display panel includes the array substrate.

20 Claims, 2 Drawing Sheets

(58) Field of Classification Search
USPC .................................................. 349/43, 110
See application file for complete search history.

(56) References Cited

U.S. PATENT DOCUMENTS

| | | |
|---|---|---|
| 9,304,349 B2 | 4/2016 | Wang |
| 9,583,646 B2 | 2/2017 | Shu et al. |
| 11,817,462 B2 | 11/2023 | Gong et al. |
| 2019/0189697 A1 | 6/2019 | Jun |

FOREIGN PATENT DOCUMENTS

| | | |
|---|---|---|
| CN | 105895581 | 8/2016 |
| CN | 107085337 | 8/2017 |
| CN | 107293567 | 10/2017 |
| CN | 109950276 | 6/2019 |
| CN | 110828476 | 2/2020 |
| CN | 111446266 | 7/2020 |
| CN | 111725324 | 9/2020 |
| CN | 112054042 | 12/2020 |

OTHER PUBLICATIONS

Notification of Office Action and Search Report Dated Sep. 27, 2024 From The State Intellectual Property Office of the People's Republic of China Re. Application No. 202210185018.8 and Its Translation Into English. (20 Pages).

* cited by examiner

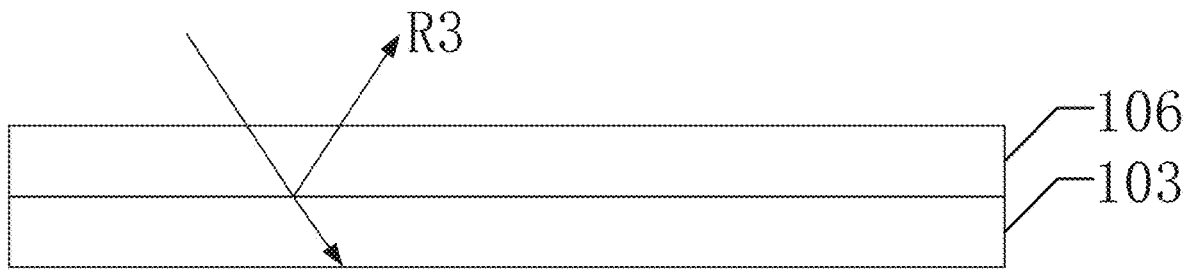

FIG. 3

```
defining an opening area and a non-opening area on a first
substrate, and forming a gate insulating layer on the first substrate in    —S1
the opening area and the non-opening area
                              ↓
forming a first interlayer insulating layer on a side of a part of
the gate insulating layer in the non-opening area away from the first
substrate, wherein a projection of the first interlayer insulating layer    —S2
on the first substrate is tangent to or separated from a projection of
the opening area on the first substrate
                              ↓
forming a second interlayer insulating layer covering the first
interlayer insulating layer in the non-opening area and a part of the       —S3
gate insulating layer in the opening area
```

FIG. 4

ARRAY SUBSTRATE, METHOD FOR FABRICATING SAME, AND DISPLAY PANEL

RELATED APPLICATIONS

This application is a National Phase of PCT Patent Application No. PCT/CN2022/080666 having International filing date of Mar. 14, 2022, which claims the benefit of priority of Chinese Patent Application No. 202210185018.8 filed on Feb. 28, 2022. The contents of the above applications are all incorporated by reference as if fully set forth herein in their entirety.

FIELD AND BACKGROUND OF THE INVENTION

The present disclosure relates to the technical field of display, and particularly to an array substrate, a method for fabricating the same, and a display panel.

With continuous popularization of electronic products, an innovation speed of the electronic products is faster, and functional requirements of the electronic products are more stringent. In particular, pursuit of a lower reflectivity of display panels has become a development trend of a future market. The lower reflectivity can bring a more comfortable visual experience to users, especially in an environment with strong external ambient light.

After natural light enters a display panel, the natural light has three main paths: transmission, absorption, and reflection. Ideally, we want light to be completely transmitted or absorbed. However, in reality, the light cannot be completely transmitted or absorbed. A main reason is that there are many layers in the display panel, and refractive indices of these layers are different. Therefore, when the light enters different layers, its angle will change, that is, there will be reflected lights. The reflected lights at different interfaces produce interference effects. A formula for a reflectivity of light entering different layers is: reflectivity $(R)=(n_1-n_2)^2/(n_1+n_2)^2$ ($n_1$ and $n_2$ are real refractive indices of two media, respectively). According to the formula $(R)=(n_1-n_2)^2/(n_1+n_2)^2$, it can be known that when refractive indices n of two adjacent layers are closer, a reflectivity at a junction between the two adjacent layers is lower.

A current low temperature polysilicon (LTPS) display panel has multiple insulating layers, so there are many contact surfaces with high reflectivities, so that the display panel has a relatively high reflectivity. When exposed to sunlight or ambient light, the display panel will have strong reflections, which reduces a contrast ratio of the display panel, thereby greatly affecting a display effect of the display panel.

SUMMARY OF THE INVENTION

A purpose of the present disclosure is to provide an array substrate, a method for fabricating the same, and a display panel, which can solve a problem that a current display panel has a relatively high reflectivity because the current display panel has many contact surfaces with high reflectivities, resulting in a decrease in a contrast ratio of the display panel, and finally a decrease in a display effect of the display panel.

In order to solve the above problem, the present disclosure provides an array substrate comprising an opening area and a non-opening area and further comprising a first substrate, a gate insulating layer, a first interlayer insulating layer, and a second interlayer insulating layer. The gate insulating layer is disposed on the first substrate and located in the opening area and the non-opening area. The first interlayer insulating layer is disposed on a side of the gate insulating layer away from the first substrate and located in the non-opening area. The second interlayer insulating layer is disposed on a side of the first interlayer insulating layer away from the first substrate and located in the opening area and the non-opening area. A projection of the first interlayer insulating layer on the first substrate is tangent to or separated from a projection of the opening area on the first substrate.

In an embodiment, a surface of a part of the second interlayer insulating layer in the opening area close to the first substrate is attached to a surface of a part of the gate insulating layer in the opening area away from the first substrate.

In an embodiment, the gate insulating layer and the second interlayer insulating layer are made of a same material.

In an embodiment, a reflectivity of light at a contact surface between a part of the second interlayer insulating layer and a part of the gate insulating layer in the opening area is less than a reflectivity of light at a contact surface between a part of the second interlayer insulating layer and a part of the first interlayer insulating layer in the non-opening area.

In an embodiment, the reflectivity of the light at the contact surface between the part of the second interlayer insulating layer and the part of the gate insulating layer in the opening area is less than a reflectivity of light at a contact surface between the part of the first interlayer insulating layer and a part of the gate insulating layer in the non-opening area.

In an embodiment, the array substrate further comprises an active layer, a gate electrode layer, and a source/drain electrode layer. The active layer is disposed between the first substrate and the gate insulating layer, is located in the non-opening area, and is made of low temperature polysilicon. The gate electrode layer is disposed between the gate insulating layer and the first interlayer insulating layer, and is located in the non-opening area. The source/drain electrode layer is disposed on a side of the second interlayer insulating layer away from the first substrate, is located in the non-opening area, and is electrically connected to the active layer.

In order to solve the above problem, the present disclosure further provides a method for fabricating an array substrate, which comprises: defining an opening area and a non-opening area on a first substrate; forming a gate insulating layer on the first substrate in the opening area and the non-opening area; forming a first interlayer insulating layer on a side of a part of the gate insulating layer in the non-opening area away from the first substrate, wherein a projection of the first interlayer insulating layer on the first substrate is tangent to or separated from a projection of the opening area on the first substrate; and forming a second interlayer insulating layer covering the first interlayer insulating layer in the non-opening area and a part of the gate insulating layer in the opening area.

In an embodiment, the forming the first interlayer insulating layer on the side of the part of the gate insulating layer in the non-opening area away from the first substrate comprises: forming the first interlayer insulating layer on a side of the gate insulating layer in the opening area and the non-opening area away from the first substrate; and removing a part of the first interlayer insulating layer in the opening area, and retaining a part of the first interlayer insulating layer in the non-opening area.

In order to solve the above problem, the present disclosure further provides a display panel comprising the aforementioned array substrate, a color filter substrate disposed opposite to the array substrate, and a liquid crystal layer disposed between the array substrate and the color filter substrate.

In an embodiment, the color filter substrate comprises a second substrate and a black matrix unit disposed on a side of the second substrate close to the first substrate. A projection of the black matrix unit on the first substrate coincides with a projection of the non-opening area on the first substrate.

In the display panel of the present disclosure, the projection of the first interlayer insulating layer on the first substrate is tangent to or separated from the projection of the opening area on the first substrate, so that the surface of the part of the second interlayer insulating layer in the opening area close to the first substrate is attached to the surface of the part of the gate insulating layer in the opening area away from the first substrate. And, the gate insulating layer and the second interlayer insulating layer are made of the same material, so as to reduce the reflectivity of the light at the contact surface between the part of the second interlayer insulating layer and the part of the gate insulating layer in the opening area, thereby reducing to reflectivity of the display panel, reducing reflection of the display panel to ambient light, improving a contrast ratio of the display panel, and improving a display effect of the display panel.

BRIEF DESCRIPTION OF THE SEVERAL VIEWS OF THE DRAWINGS

In order to more clearly illustrate technical solutions in embodiments of the present disclosure, a brief description of accompanying drawings used in a description of the embodiments will be given below. Obviously, the accompanying drawings in the following description are merely some embodiments of the present disclosure. For those skilled in the art, other drawings may be obtained from these accompanying drawings without creative labor.

FIG. 3 is a schematic diagram of reflection of light at a contact surface between a part of a second interlayer insulating layer and a part of the gate insulating layer in an opening area.

FIG. 4 is a schematic flowchart of a method for fabricating an array substrate according to an embodiment of the present disclosure.

DESCRIPTION OF SPECIFIC EMBODIMENTS OF THE INVENTION

Figure 1:
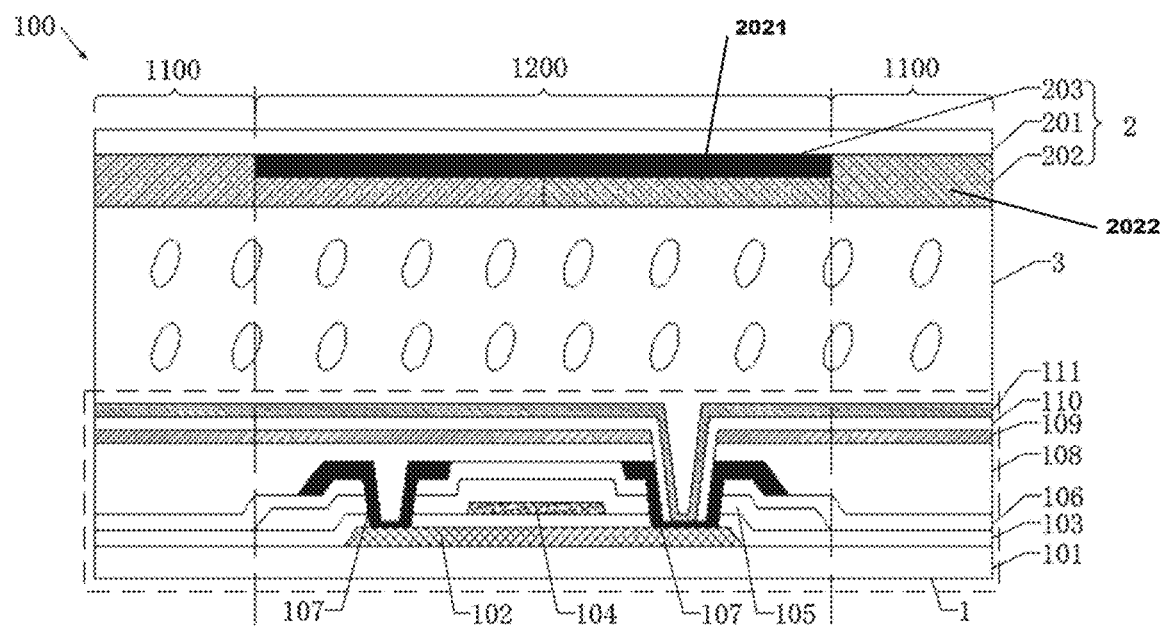
FIG. 1 is a schematic structural diagram of a display panel according to an embodiment of the present disclosure.

Preferred embodiments of the present disclosure are described in detail below with reference to the accompanying drawings, so as to fully introduce a technical content of the present invention to those skilled in the art, to demonstrate that the present invention can be implemented, thereby making the technical content of the present invention clearer, and making it easier for those skilled in the art to understand how to implement the present invention. However, the present invention can be embodied by many different embodiments. The claimed scope of the present invention is not limited to the embodiments described herein. The description of the embodiments below is not intended to limit the claimed scope of the present invention.

Directional terms mentioned in the present disclosure, such as "above", "below", "front", "back", "left", "right", "inside", "outside", "side", are merely used to indicate directions of the accompanying drawings. The directional terms are used for explaining and illustrating the present invention rather than limiting the claimed scope of the present invention.

In the accompanying drawings, components with a same structure are indicated by similar reference numerals. Components that are similar in structure or function are indicated by a same reference numeral. In addition, for ease of understanding and description, a size and thickness of each component shown in the accompanying drawings are arbitrarily shown, and the size and thickness of each component are not limited in the present disclosure.

Embodiment 1

Please refer to FIG. 1, the present disclosure provides a display panel 100. The display panel 100 comprises an array substrate 1, a color filter substrate 2, and a liquid crystal layer 3.

The array substrate 1 comprises an opening area 1100 and a non-opening area 1200. The array substrate 1 further comprises a first substrate 101, an active layer 102, a gate insulating layer 103, a gate electrode layer 104, a first interlayer insulating layer 105, a second interlayer insulating layer 106, a source/drain electrode layer 107, a planarization layer 108, a common electrode layer 109, a passivation layer 110, and a pixel electrode layer 111.

The first substrate 101 is made of one or more of glass, polyimide, polycarbonate, polyethylene terephthalate, and polyethylene naphthalate, so that the first substrate 101 has a better impact resistance, and can effectively protect the display panel 100. In this embodiment, the first substrate 101 is made of glass.

The active layer 102 is disposed on a side of the first substrate 101 close to the color filter substrate 2. The active layer 102 is located in the non-opening area 1200. In this embodiment, the active layer 102 is made of low temperature polysilicon.

The gate insulating layer 103 covers a side of the active layer 102 away from the first substrate 101, and extends to cover the first substrate 101. The gate insulating layer 103 is located in the opening area 1100 and the non-opening area 1200. The gate insulating layer 103 is mainly used to prevent short circuit due to contact between the active layer 102 and the gate electrode layer 104. The gate insulating layer 103 may be made of SiOx, SiNx, $Al_2O_3$, a combined structure of SiNx and SiOx, a combined structure of SiOx, SiNx, and SiOx, or the like. In this embodiment, the gate insulating layer 103 is made of SiOx.

The gate electrode layer 104 is disposed on a side of the gate insulating layer 103 away from the first substrate 101 and located in the non-opening area 1200. The gate electrode layer 104 may be made of Mo, a combined structure of Mo and Al, a combined structure of Mo and Cu, a combined structure of Mo, Cu, and indium zinc oxide (IZO), a combined structure of IZO, Cu, and IZO, a combined structure of Mo, Cu, and indium tin oxide (ITO), a combined structure of Ni, Cu, and Ni, a combined structure of NiCr, Cu, and NiCr, CuNb, or the like.

The first interlayer insulating layer 105 covers a side of the gate electrode layer 104 away from the first substrate 101 and extends to cover a surface of a part of the gate insulating layer 103 in the non-opening area 1200 away from the first substrate 101. There are grain boundaries among the polysilicon grains, and there is an interface between polysilicon (the active layer 102) and an oxide layer (the gate insulating layer 103), which affects electrical properties of a thin film transistor. Therefore, hydrogenation treatment is generally used to improve conductivity, electron mobility, and threshold voltage uniformity of the thin film transistor. In this embodiment, the first interlayer insulating layer 105 is made of SiNx as a source of hydrogen atoms. The first interlayer insulating layer 105 is baked at a specific temperature to diffuse hydrogen atoms into the active layer 102 (polysilicon) and the gate insulating layer 103 (the oxide layer).

A projection of the first interlayer insulating layer 105 on the first substrate 101 is tangent to or separated from a projection of the opening area 1100 on the first substrate 101. In other words, the first interlayer insulating layer 105 is only disposed in the non-opening area 1200, but not disposed in the opening area 1100.

The second interlayer insulating layer 106 covers a side of the first interlayer insulating layer 105 away from the first substrate 101, and is located in the opening area 1100 and the non-opening area 1200. The second interlayer insulating layer 106 is made of a same material as the gate insulating layer 103. That is, in this embodiment, the second interlayer insulating layer 106 is made of SiOx.

A surface of a part of the second interlayer insulating layer 106 in the opening area 1100 close to the first substrate 101 is attached to a surface of a part of the gate insulating layer 103 in the opening area 1100 away from the first substrate 101.

The source/drain electrode layer 107 is disposed on a side of the second interlayer insulating layer 106 away from the first substrate 101, is located in the non-opening area 1200, and is electrically connected to the active layer 102. The source/drain electrode layer 107 may be made of Mo, a combined structure of Mo and Al, a combined structure of Mo and Cu, a combined structure of Mo, Cu, and indium zinc oxide (IZO), a combined structure of IZO, Cu, and IZO, a combined structure of Mo, Cu, and indium tin oxide (ITO), a combined structure of Ni, Cu, and Ni, a combined structure of NiCr, Cu, and NiCr, CuNb, or the like.

The planarization layer 108 covers a side of the source/drain electrode layer 107 away from the first substrate 101, and extends to cover a surface of the second interlayer insulating layer 106 away from the first substrate 101. The planarization layer 108 is located in the opening area 1100 and the non-opening area 1200. The planarization layer 108 may be made of SiOx, SiNx, SiNOx, a combined structure of SiNx and SiOx, or the like. In this embodiment, the planarization layer 108 is made of SiOx.

The common electrode layer 109 is disposed on a surface of the planarization layer 108 away from the first substrate 101. In this embodiment, the common electrode layer 109 is made of indium tin oxide (ITO).

The passivation layer 110 is disposed on a surface of the common electrode layer 109 away from the first substrate 101. The passivation layer 110 is mainly used to prevent short circuit due to contact between the common electrode layer 109 and the pixel electrode layer 111. The passivation layer 110 may be made of SiOx, SiNx, Al$_2$O$_3$, a combined structure of SiNx and SiOx, a combined structure of SiOx, SiNx, and SiOx, or the like. In this embodiment, the passivation layer 110 is made of SiOx.

The pixel electrode layer 111 is disposed on a surface of the passivation layer 110 away from the first substrate 101. In this embodiment, the pixel electrode layer 111 is made of indium tin oxide (ITO).

In this embodiment, the second interlayer insulating layer 106 is made of SiOx, the first interlayer insulating layer is made of SiNx, and the gate insulating layer 103 is made of SiOx. In actual measurement, a refractive index of the second interlayer insulating layer 106 is 1.47, a refractive index of the first interlayer insulating layer 105 is 1.87, and a refractive index of the gate insulating layer 103 is 1.45.

Figure 2:
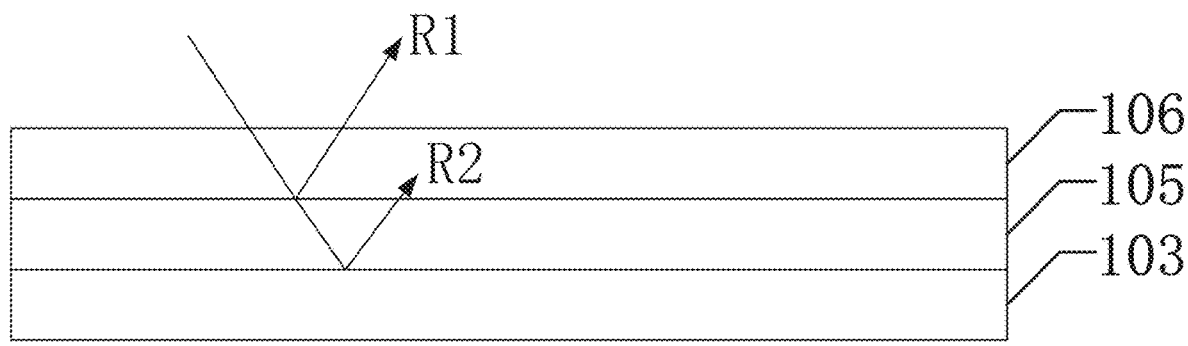
FIG. 2 is a schematic diagram of reflection of light at a contact surface between a part of a second interlayer insulating layer and a part of a first interlayer insulating layer and a contact surface between the part of the first interlayer insulating layer and a part of a gate insulating layer in a non-opening area.

Please refer to FIG. 2, $R_1=(1.47-1.87)^2/(1.47+1.87)^2=1.43\%$, and $R_2=(1.87-1.45)^2/(1.87+1.45)^2=1.6\%$.

Please refer to FIG. 3, $R_3=(1.47-1.45)^2/(1.47+1.45)^2=0.005\%$. $R_3$ is less than $R_1+R_2$. In the display panel 100 of the present disclosure, the projection of the first interlayer insulating layer 105 on the first substrate 101 is tangent to or separated from the projection of the opening area 1100 on the first substrate 101, so that the surface of the part of the second interlayer insulating layer 106 in the opening area 1100 close to the first substrate 101 is attached to the surface of the part of the gate insulating layer 103 in the opening area 1100 away from the first substrate 101. And, the gate insulating layer 103 and the second interlayer insulating layer 106 are made of the same material, so as to reduce a reflectivity of light at a contact surface between the part of the second interlayer insulating layer 106 and the part of the gate insulating layer 103 in the opening area 1100 without affecting characteristics of a thin film transistor (TFT) of the array substrate 1. Therefore, the reflectivity of the light at the contact surface between the part of the second interlayer insulating layer 106 and the part of the gate insulating layer 103 in the opening area 1100 is less than a reflectivity of light at a contact surface between a part of the second interlayer insulating layer 106 and a part of the first interlayer insulating layer 105 in the non-opening area 1200. The reflectivity of the light at the contact surface between the part of the second interlayer insulating layer 106 and the part of the gate insulating layer 103 in the opening area 1100 is less than a reflectivity of light at a contact surface between the part of the first interlayer insulating layer 105 and a part of the gate insulating layer 103 in the non-opening area 1200. This reduces a reflectivity of the display panel, thereby reducing reflection of the display panel to ambient light, improving a contrast ratio of the display panel, and improving a display effect of the display panel.

The color filter substrate 2 is disposed opposite to the array substrate 1. The color filter substrate 2 comprises a second substrate 201, a plurality of color resist units 202, and a plurality of black matrix units 203.

The second substrate 201 is made of one or more of glass, polyimide, polycarbonate, polyethylene terephthalate, and polyethylene naphthalate, so that the second substrate 201 has a better impact resistance, and can effectively protect the display panel 100. In this embodiment, the second substrate 201 is made of glass.

The black matrix units 203 are disposed on a surface of the second substrate 201 close to the first substrate 101 at intervals. The black matrix units 203 are configured to prevent cross-color. A projection of one black matrix unit 203 on the first substrate 101 coincides with a projection of one non-opening area 1200 on the first substrate 101. The color resist units 202 are disposed on surfaces of the black matrix units 203 close to the first substrate 101, and extends to cover the surface of the second substrate 201 close to the first substrate 101. The color resist units 202 comprise red color resist units, green color resist units, and blue color resist units. A projection of one color resist unit 202 on the first substrate 101 overlaps with the projection of the opening area 1100 on the first substrate 101. The color resist units 202 include first color resist parts 2021 and second color resist parts 2022 connected to each other. The first color resist parts 2021 are disposed on surfaces of the black matrix units 203 close to the first substrate 101, and the second color resist parts 2022 are disposed on a surface of the second substrate 201 close to the first substrate 101. A projection of one of the first color resist parts 2021 on the first substrate 101 coincides with a corresponding one of the black matrix units 203 on the first substrate 101, and a projection of one of the second color resist units 2022 on the first substrate 101 coincides with the projection of the opening area 1100 on the first substrate 101.

The liquid crystal layer 3 is disposed between the array substrate 1 and the color filter substrate 2.

Please refer to FIG. 1 and FIG. 4, the present disclosure further provides a method for fabricating an array substrate 1, which comprises the following steps. Step S1: defining an opening area 1100 and a non-opening area 1200 on a first substrate 101, and forming a gate insulating layer 103 on the first substrate 101 in the opening area 1100 and the non-opening area 1200. Step S2: forming a first interlayer insulating layer 105 on a side of a part of the gate insulating layer 103 in the non-opening area 1200 away from the first substrate 101, wherein a projection of the first interlayer insulating layer 105 on the first substrate 101 is tangent to or separated from a projection of the opening area 1100 on the first substrate 101. Step S3: forming a second interlayer insulating layer 106 covering the first interlayer insulating layer 105 in the non-opening area 1200 and a part of the gate insulating layer 103 in the opening area 1100.

Step S2 comprises: forming the first interlayer insulating layer 105 on a side of the gate insulating layer 103 in the opening area 1100 and the non-opening area 1200 away from the first substrate 101, removing a part of the first interlayer insulating layer 105 in the opening area 1100, and retaining a part of the first interlayer insulating layer 105 in the non-opening area 1200.

The array substrate, the method for fabricating the same, and the display panel provided by the present disclosure are described in detail above. The present disclosure uses specific embodiments to describe principles and implementations of the present disclosure. The above description of the embodiments is only for helping to understand solutions and core ideas of the present disclosure. Furthermore, those skilled in the art may make modifications to the specific embodiments and applications according to ideas of the present disclosure. In conclusion, the present specification should not be construed as a limitation to the present disclosure.

What is claimed is:

1. An array substrate, comprising an opening area and a non-opening area, and further comprising:
    a first substrate;
    an active layer disposed on the first substrate and located in the non-opening area;
    a gate insulating layer covering a side of the active layer away from the first substrate and located in the opening area and the non-opening area;
    a gate electrode layer disposed on a side of the gate insulating layer away from the first substrate, and located in the non-opening area; and
    a first interlayer insulating layer disposed on a side of the gate electrode layer and the gate insulating layer away from the first substrate and located in the non-opening area;
    a second interlayer insulating layer disposed on a side of the first interlayer insulating layer away from the first substrate and located in the opening area and the non-opening area; and
    a source/drain electrode layer disposed on a side of the second interlayer insulating layer away from the first substrate, located in the non-opening area, and electrically connected to the active layer through via holes going through the second interlayer insulating layer, the first interlayer insulating layer, and the gate insulating layer;
    wherein a projection of the first interlayer insulating layer on the first substrate is tangent to or separated from a projection of the opening area on the first substrate; a surface of a part of the second interlayer insulating layer in the opening area close to the first substrate is attached to a surface of a part of the gate insulating layer in the opening area away from the first substrate.

2. The array substrate according to claim 1, wherein the gate insulating layer and the second interlayer insulating layer are made of a same material.

3. The array substrate according to claim 1, wherein a reflectivity of light at a contact surface between a part of the second interlayer insulating layer and a part of the gate insulating layer in the opening area is less than a reflectivity of light at a contact surface between a part of the second interlayer insulating layer and a part of the first interlayer insulating layer in the non-opening area.

4. The array substrate according to claim 3, wherein the reflectivity of the light at the contact surface between the part of the second interlayer insulating layer and the part of the gate insulating layer in the opening area is less than a reflectivity of light at a contact surface between the part of the first interlayer insulating layer and a part of the gate insulating layer in the non-opening area.

5. The array substrate according to claim 1,
    wherein the active layer is made of low temperature polysilicon.

6. The array substrate according to claim 2, wherein the gate insulating layer and the second interlayer insulating layer are made of SiOx, and the first interlayer insulating layer is made of SiNx.

7. The array substrate according to claim 1, wherein the array substrate further comprises:
    a planarization layer covering a side of the source/drain electrode layer away from the first substrate and located in the opening area and the non-opening area, wherein a surface of a part of the planarization layer in the opening area close to the first substrate is attached to the surface of a part of the second interlayer insulating layer in the opening area away from the first substrate.

8. The array substrate according to claim 7, wherein the planarization layer is made of SiOx.

9. The array substrate according to claim 7, wherein a thickness of a part of the planarization layer in the opening area is greater than a thickness of a part of the planarization layer in the non-opening area.

10. A method for fabricating an array substrate, comprising:
    defining an opening area and a non-opening area on a first substrate;
    forming an active layer disposed on the first substrate and located in the non-opening area;

forming a gate insulating layer covering a side of the active layer away from the first substrate and located in the opening area and the non-opening area;

forming a gate electrode layer disposed on a side of the gate insulating layer away from the first substrate and located in the non-opening area;

forming a first interlayer insulating layer on a side of a part of the gate electrode layer and the gate insulating layer in the non-opening area away from the first substrate, wherein a projection of the first interlayer insulating layer on the first substrate is tangent to or separated from a projection of the opening area on the first substrate;

forming a second interlayer insulating layer located on a side of the first interlayer insulating layer in the non-opening area away from the first substrate and covering a part of the gate insulating layer in the opening area, wherein a surface of a part of the second interlayer insulating layer in the opening area close to the first substrate is attached to a surface of a part of the gate insulating layer in the opening area away from the first substrate; and forming a source/drain electrode layer disposed on a side of the second interlayer insulating layer away from the first substrate, located in the non-opening area, and electrically connected to the active layer through via holes going through the second interlayer insulating layer, the first interlayer insulating layer, and the gate insulating layer.

11. The method for fabricating the array substrate according to claim 10, wherein the forming the first interlayer insulating layer on the side of the part of the gate insulating layer in the non-opening area away from the first substrate comprises:

forming the first interlayer insulating layer on a side of the gate insulating layer in the opening area and the non-opening area away from the first substrate; and removing a part of the first interlayer insulating layer in the opening area, and retaining a part of the first interlayer insulating layer in the non-opening area.

12. A display panel, comprising an array substrate, a color filter substrate disposed opposite to the array substrate, and a liquid crystal layer disposed between the array substrate and the color filter substrate, wherein the array substrate comprises an opening area and a non-opening area and further comprises:

a first substrate;

an active layer disposed on the first substrate and located in the non-opening area;

a gate insulating layer covering a side of the active layer away from the first substrate and located in the opening area and the non-opening area;

a gate electrode layer disposed on a side of the gate insulating layer away from the first substrate, and located in the non-opening area; and a first interlayer insulating layer disposed on a side of the gate electrode layer and the gate insulating layer away from the first substrate and located in the non-opening area;

a second interlayer insulating layer disposed on a side of the first interlayer insulating layer away from the first substrate and located in the opening area and the non-opening area; and a source/drain electrode layer disposed on a side of the second interlayer insulating layer away from the first substrate, located in the non-opening area, and electrically connected to the active layer through via holes going through the second interlayer insulating layer, the first interlayer insulating layer, and the gate insulating layer;

wherein a projection of the first interlayer insulating layer on the first substrate is tangent to or separated from a projection of the opening area on the first substrate; a surface of a part of the second interlayer insulating layer in the opening area close to the first substrate is attached to a surface of a part of the gate insulating layer in the opening area away from the first substrate.

13. The display panel according to claim 12, wherein the gate insulating layer and the second interlayer insulating layer are made of a same material.

14. The display panel according to claim 12, wherein a reflectivity of light at a contact surface between a part of the second interlayer insulating layer and a part of the gate insulating layer in the opening area is less than a reflectivity of light at a contact surface between a part of the second interlayer insulating layer and a part of the first interlayer insulating layer in the non-opening area.

15. The display panel according to claim 14, wherein the reflectivity of the light at the contact surface between the part of the second interlayer insulating layer and the part of the gate insulating layer in the opening area is less than a reflectivity of light at a contact surface between the part of the first interlayer insulating layer and a part of the gate insulating layer in the non-opening area.

16. The display panel according to claim 12, wherein the active layer is made of low temperature polysilicon.

17. The display panel according to claim 12, wherein the color filter substrate comprises:

a second substrate; and a plurality of black matrix units disposed at intervals on a side of the second substrate close to the first substrate, wherein a projection of the black matrix unit on the first substrate coincides with a projection of the non-opening area on the first substrate.

18. The display panel according to claim 17, wherein the color filter substrate further comprises:

a plurality of color resist units comprising first color resist parts and second color resist parts connected to each other, the first color resist parts are disposed on surfaces of the black matrix units close to the first substrate, and the second color resist parts are disposed on a surface of the second substrate close to the first substrate;

wherein a projection of one of the first color resist parts on the first substrate coincides with a corresponding one of the black matrix units on the first substrate, and a projection of one of the second color resist units on the first substrate coincides with the projection of the opening area on the first substrate.

19. The display panel according to claim 18, wherein a contact surface is provided between a surface of the second interlayer insulating layer close to the first substrate and a surface of the gate interlayer layer away from the first substrate, and a projection of the contact surface on the first substrate covers a projection of a corresponding one of the second color resist parts on the first substrate.

20. The display panel according to claim 13, wherein the gate insulating layer and the second interlayer insulating layer are made of SiOx, and the first interlayer insulating layer is made of SiNx.

* * * * *